United States Patent [19]

Reimer

[11] 4,308,457
[45] Dec. 29, 1981

[54] DEVICE FOR THE DETECTION OF BACK-SCATTERED ELECTRONS FROM A SAMPLE IN AN ELECTRON MICROSCOPE

[75] Inventor: Ludwig Reimer, Muenster, Fed. Rep. of Germany

[73] Assignee: Ernst Leitz Wetzler GmbH, Wetzlar, Fed. Rep. of Germany

[21] Appl. No.: 151,820

[22] Filed: May 21, 1980

[30] Foreign Application Priority Data

May 25, 1979 [DE] Fed. Rep. of Germany ....... 2921151

[51] Int. Cl.³ .......................................... G01M 23/00
[52] U.S. Cl. ..................................... 250/311; 250/310
[58] Field of Search .............................. 250/311, 310

[56] References Cited

U.S. PATENT DOCUMENTS

| 3,714,424 | 1/1973 | Weber | 250/310 |
| 4,041,311 | 8/1977 | Martin | 250/311 |
| 4,219,731 | 8/1980 | Migitaka et al. | 250/310 |

*Primary Examiner*—Harold A. Dixon
*Attorney, Agent, or Firm*—Schwartz, Jeffery, Schwaab, Mack, Blumenthal & Koch

[57] ABSTRACT

Disclosed is a device for the detection of back-scattered electrons emitted by a specimen in an electron microscope, comprising a converter for converting back-scattered electrons emitted by the specimen into secondary electrons, which converter includes a surface layer of a crystalline material having a low atomic number and a low electrical conductivity, preferably magnesium oxide; and a detector for detecting secondary electrons emitted by the converter. Also disclosed is an improved electron microscope embodying this detection device.

11 Claims, 2 Drawing Figures

DEVICE FOR THE DETECTION OF BACK-SCATTERED ELECTRONS FROM A SAMPLE IN AN ELECTRON MICROSCOPE

BACKGROUND OF THE INVENTION

The present invention relates to a device for the detection of back-scattered electrons emitted by a specimen in an electron microscope, and more particularly to such a device having a converter to convert the back-scattered electrons into secondary electrons and a detector for the secondary electrons.

In an electron microscope, the specimen to be examined is exposed to the impact of an electron beam. In the process, low energy secondary electrons are released by the specimen. Furthermore, a greater fraction of the incident electrons are scattered on the specimen with a slight loss of energy. These back-scattered electrons in turn produce secondary electrons upon their impact on the walls or other parts of the object chamber or during their repeated collision with the specimen, which are detected by a secondary electron detector together with the secondary electrons originally released by the specimen. Of the back-scattered electrons themselves, only those that are scattered in the direction of the detector are detected.

Since the secondary electrons released from the specimen and the back-scattered electrons scattered on the specimen contain different information concerning the specimen, attempts have therefore been made to detect them independently from one another and as completely as possible. An apparatus partially suitable for the purpose has been described in *Scanning Electron Microscopy* (1978), Volume 1, pages 303 to 310.

In order to separate the secondary electrons from the specimen from the back-scattered electrons, the specimen is provided with a shielding grid. A negative potential applied to the shielding grid retains the low energy secondary electrons. The higher-energy back-scattered electrons pass through the shielding grid and, upon their impact on the walls of the chamber and in particular on the pole piece of the electron optical device adjacent to the specimen, they release secondary electrons. A field of positive potential in front of the secondary electron detector draws these secondary electrons into the detector. It has been proposed in this connection to increase the number of secondary electrons produced by the back-scattered electrons by arranging a plate with a high secondary electron emission coefficient in front of the pole pieces of the electron optical device. Furthermore, a special configuration of this electron conversion plate is intended to insure the detection of as many as possible of the secondary electrons by the detector. Even though this known apparatus makes it possible to separately detect the back-scattered electrons by means of their increased conversion into secondary electrons, it is not feasible to measure the secondary electrons produced on the specimen separately from the back-scattered electrons.

The secondary electrons produced at the specimen may be detected together with the back-scattered electrons, when the shielding grid over the specimen is grounded or has a weak positive potential applied to it. It is found, however, that the information contained in the primary flow of secondary electrons is masked increasingly by the flow of secondary electrons produced by the conversion.

SUMMARY OF THE INVENTION

It is therefore an object of the present invention to provide an improved device for the detection of back-scattered electrons in an electron microscope.

Another object of the invention is to improve the advantages obtained in the detection of back-scattered electrons.

It is also an object of the invention to provide a particular suitable converter and simultaneously to render it possible to detect the secondary electrons released from the specimen separately from the secondary electrons produced by the conversion of the back-scattered electrons.

Still another object of the invention resides in the provision of an improved electron microscope including the improved back-scatter device of the invention.

In accomplishing the foregoing objects, there has been provided according to the present invention a device for the detection of back-scattered electrons emitted by a specimen in an electron microscope, comprising a converter for converting back-scattered electrons emitted by the specimen into secondary electrons, this converter including a surface layer of a crystalline material having a low atomic number and a low electrical conductivity, preferably, magnesium oxide; and a detector for detecting secondary electrons emitted by the converter. Preferably, the device further comprises means for producing an electric field overlying the converter, wherein this means preferably comprises a conductive grid overlapping the coated surface of the converter and an insulating connector for connecting the grid to the edge of the converter.

The invention also provides an improved electron microscope embodying the foregoing detection device.

Further objects, features and advantages of the invention will become apparent from the detailed description of preferred embodiments which follows, when considered together with the attached figures of drawing.

BRIEF DESCRIPTION OF THE DRAWINGS

In the drawings, an exemplary embodiment of the device according to the invention is represented schematically. It shall be described in more detail with the aid of the figures.

In the drawing.

DETAILED DESCRIPTION OF PREFERRED EMBODIMENTS

The present invention provides a device of the above-mentioned type which includes a converter coated with a crystalline material having a low atomic number and a slight electrical conductivity. Magnesium oxide has been found to be particularly advantageous. A converter comprising a metallic carrier plate with a vapor-deposited layer of magnesium oxide is especially suitable. The converter may be equipped on the metallic carrier plate with a connecting device for the application of an electrical potential. An electrical conductor may further be associated with the converter, in order to produce an overlying potential field. It is advantageous to provide the electric conductor in the form of a grid overlapping the surface of the converter and secured by means of an electric insulator to the edge of the converter.

The converter may also consist of a plurality of parts, wherein the individual parts are associated with different back-scattering spatial angle ranges.

It is known from the technology of electron microscope specimen preparation to coat the specimen with gold by means of vapor-deposition, because as a good electric conductor, gold prevents the buildup of electrostatic charges and additionally provides a good yield of secondary electrons. Experiments to develop a back-scattered electron converter having an increased conversion rate have shown, however, that a coating of vapor-deposited gold is entirely useless and that an element or a compound with a low atomic number must be selected. In the process, it was found surprisingly that possible buildups of electrostatic charges do not affect the sensitivity of detection of the arrangement. As an additional, unforeseeable advantageous effect, it has also been observed that the coating according to the invention provides a constant rate of conversion over broad energy ranges of back-scattered electrons. Furthermore, the crystalline structure of the magnesium oxide layer reduces the back-scattering behavior of the converter plate, so that fewer doubly scattered electrons are produced. As a result of arranging a shielding grid having a suitable potential in front of the converter prepared according to the invention, the contribution of back-scattered electrons to the signal of the detector can be selectively suppressed, so that a significantly improved detection of secondary electrons released from the specimen may be obtained.

The division of the converter into a plurality of parts acting independently of each other makes possible directional discrimination of the back-scattered electrons.

Figure 1:
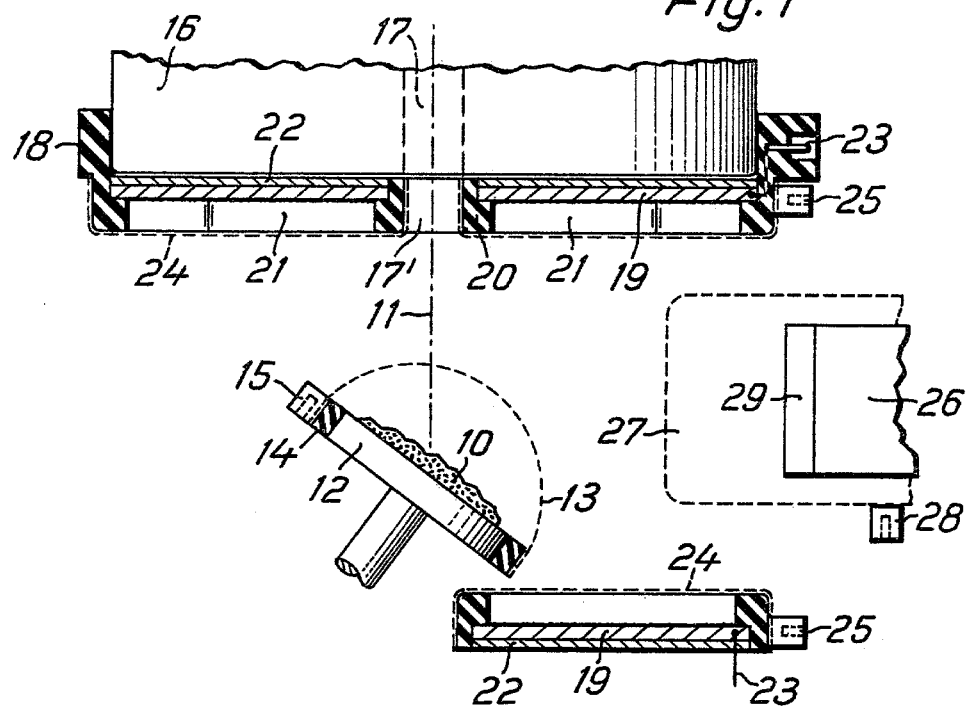
FIG. 1 is a schematic partial plan view illustrating the layout and arrangement of the converter in an electron microscope.

Referring now to the drawings, in FIG. 1 a specimen 10 to be examined by electron optical means rests on a specimen holder 12 tiltable with respect to the optical axis 11 of the electron microscope. A shielding grid 13 is placed over the specimen 10. The shielding grid is connected by way of an insulator 14 with the specimen holder 12. By means of connector 15, the shielding grid 13 may be connected with a source of electric potential.

A pole piece 16 of an electron lens (not shown in further detail) is located opposite the specimen 10. The electron beam passes through a bore hole 17. A holding ring 18 made of an insulating material, for example Teflon, is slid onto the pole piece 16 and a converter plate 19 is placed into this holding ring.

Figure 2:
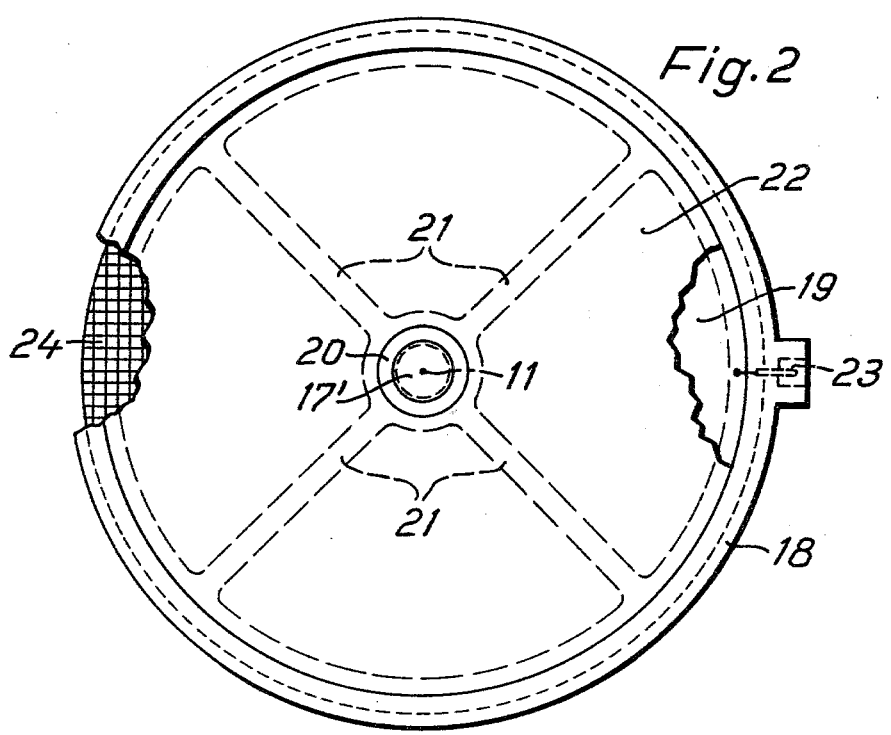
FIG. 2 is a top view of the converter.

The holding ring 18 is shown in a top view in FIG. 2. It has an orifice 17' in its center for the passage of the electron beam. The center ring 20 around this orifice is supported, for example, by means of radial supports 21 in the holder ring 18.

The converter plate 19 is insulated by means of a Teflon disk 22 with respect to the pole piece 16. On its side facing the specimen 10, the converter plate 19 is coated with a layer of vapor-deposited magnesium oxide; it appears as a thin, crystalline layer on the carrier plate, which, for example, may be made of brass. The converter plate is equipped with a connector 23 for the application of an electric potential.

Over the holding ring 18/20, as another measure according to the invention, a shielding grid 24 is mounted, which again is equipped with a connector 25 for the application of an electric potential. The shielding grid 24 consists, for example, of a fine wire mesh which, however, as a function of the potential of the converter plate, may also be of a coarse mesh or may consist of a simple ring.

A further converter is arranged beneath the specimen 10; it is similar to the converter arranged beneath the pole piece 16, and similar parts therein carry identical designations. The secondary electron detector 26 is of a known design and is shown only with its electron receptor part. A grid 27, connected by way of a connector 28 with a source of electrical potential, produces a potential field which conducts the electrons released from the specimen and the converter plate onto a scintillator 29.

In order to measure the electrons back-scattered from the specimen 10 independently of the secondary electrons released directly, the shielding grid 13 is charged with a negative potential with respect to the specimen 10. The converter plate 19 receives a negative potential with respect to the shielding grid 24, which advantageously is grounded, together with the specimen 10. If the shielding grid 24 is grounded, it has the same potential as the central passage 17 in the pole piece 16. Because the shielding grid 24 also overlaps the peripheral areas of the converter plate 19, their potential field does not affect the beam range of the primary electron beam, so that there is no interference with the focusing of the primary electron beam by this arrangement.

The converter plate located beneath the pole piece 16 covers a large spatial angle of the back-scattered electrons in the reverse direction and is therefore particularly suitable for the imaging of material contrasts.

By virtue of the arrangement of the shielding grid 24 over the converter plate 19, it is now also possible to detect the secondary electrons released from the specimen 10 independently of the back-scattered electrons. For this purpose, the grid 13 above the specimen 10 is charged with a positive potential and the converter plate 19 is also charged positively with respect to the shielding grid 24, which remains grounded. In this manner, the secondary electrons produced by the back-scattered electrons on the converter plate 19 are retained. Because of the low back-scattering coefficient of the magnesium oxide layer, fewer back-scattered electrons capable of passing through the shielding grid 24 and releasing secondary electrons on the walls of the chamber are scattered on the converter plate for the second time.

In a third mode of operation, both the secondary electrons produced on the converter plate 19 beneath the pole shoe 16 and the secondary electrons produced on the specimen may be suppressed in the manner described hereinabove, and only the secondary electrons produced at the converter plate arranged laterally under the specimen detected. In the case of an inclined specimen, this converter plate detects the forward-scattered electrons and is thus particularly suitable for the measurement of topographical contrasts.

With respect to the directional selection of the back-scattered electrons, it is particularly advantageous to divide the converter plate 19 arranged beneath the pole shoe 16 into a plurality of segments, which may be independently actuated with regard to permeability by the secondary electrons, by the application of different potentials. For this purpose, individual converter plates may be inserted into the fields of the holding ring 18 illustrated in FIG. 2. These converter plates are each equipped with connectors 23 for the separate application of potentials. These fields can obviously also consist of concentric rings or represent a combination of segments and rings.

In order to design a converter plate which is easy to manufacture, the use of plates intended for printed circuits has been found to be highly advantageous. These plates consist of a solid, electrically insulating carrier with a coating of copper. The copper layer may be divided with the aid of photographic etching techniques into individual fields of any desired configuration, each of them having its own power connection. The conversion-enhancing coating is applied to the converter plate prepared in this manner. After removal of the layers of copper adjacent the edges, the shielding grid can be attached there to the insulating carrier plate.

While not preferred, it is also possible according to the invention to employ as the surface layer of the converter other crystalline material having a low atomic number and a low electrical conductivity. For example, other alkali metal and alkaline earth metal oxides and halides of low atomic number may be used. Potassium chloride, for example, provides results similar to magnesium oxide, but the conversion rate is substantially lower. Those surface coating materials are preferred which provide a relatively porous layer of crystals having crystal sizes on the order of one or a few microns, rather than a compact layer.

What is claimed is:

1. A device for the detection of back-scattered electrons emitted by a specimen in an electron microscope, comprising:
   a converter for converting back-scattered electrons emitted by the specimen into secondary electrons, said converter including a surface layer of a crystalline material having a low atomic number and a low electrical conductivity; and
   a detector for detecting secondary electrons emitted by said converter.

2. A device as claimed in claim 1, wherein said crystalline material comprises magnesium oxide.

3. A device as claimed in claim 1, wherein said converter comprises a metallic carrier plate having a vapor-deposited layer of said crystalline material.

4. A device as claimed in claim 3, wherein said converter further comprises an electrical connector attached to said metallic carrier plate for applying an electrical potential thereto.

5. A device as claimed in claim 1, further comprising means for producing an electrical field overlying said converter.

6. A device as claimed in claim 5, wherein said electric field producing means comprises a conductive grid overlapping the coated surface of said converter and an insulating connector for connecting said grid to the edge of said converter.

7. A device as claimed in claim 5, further comprising means for producing an electric field overlying the specimen.

8. A device as claimed in claim 1, comprising a first converter arranged between the specimen and the source of the electron beam in the electron microscope, and a second converter located on the side of the specimen opposite to the source of the electron beam in the electron microscope.

9. A device as claimed in claim 1, wherein said converter comprises a plurality of converter sections, each of said sections being arranged to receive back-scattered electrons emitted within different spatial angular ranges.

10. A device as claimed in claim 9, wherein each of said converter sections is electrically insulated from the others and includes separate means for independently applying a selected electrical potential thereto.

11. An electron microscope, comprising a source of an electron beam, means for holding a specimen and a device for detecting back-scattered electrons emitted by the specimen, said device comprising a device as defined by claim 1.

* * * * *